(12) United States Patent
Tu et al.

(10) Patent No.: US 6,720,509 B2
(45) Date of Patent: Apr. 13, 2004

(54) VAPOR CONTROLLED CZOCHRALSKI (VCZ) SINGLE CRYSTAL GROWTH APPARATUS

(75) Inventors: Hailing Tu, Beijing (CN); Yonghong Wang, Beijing (CN); Jiayu Qian, Beijing (CN); Ping Song, Beijing (CN); Fengyi Zhang, Beijing (CN)

(73) Assignee: General Research Institute for Nonferrous Metals, Beijing (CN)

( * ) Notice: Subject to any disclaimer, the term of this patent is extended or adjusted under 35 U.S.C. 154(b) by 117 days.

(21) Appl. No.: 10/015,068

(22) Filed: Oct. 26, 2001

(65) Prior Publication Data

US 2002/0144648 A1 Oct. 10, 2002

(30) Foreign Application Priority Data

Apr. 6, 2001 (CN) ........................................ 01219206 U

(51) Int. Cl.$^7$ ............................................... C30B 35/00
(52) U.S. Cl. .................... 200/215; 200/208; 200/215
(58) Field of Search ................... 117/200, 208, 117/215

(56) References Cited

U.S. PATENT DOCUMENTS 6,358,314 B1 * 3/2002 Li ............................. 117/13

OTHER PUBLICATIONS

Wolf et al., Silicon Processing for the VLSI Era, vol. 1: Process Technology, Lattice Press, Sunset Beeach, CA, USA, pp. 1–35, 1986.*

* cited by examiner

Primary Examiner—Nadine G. Norton
Assistant Examiner—Matthew Anderson
(74) Attorney, Agent, or Firm—Ladas & Parry

(57) ABSTRACT

The present invention relates to semiconductor crystal growth equipments. A vapor controlled czochralski (VCZ) single crystal growth apparatus comprises a single crystal furnace, a heating unit, a mechanical transmission unit, and a gaseous adjustment unit. A hot-wall sealed container is mounted in the single crystal furnace, and a crucible is mounted within the hot-wall sealed container. The hot-wall sealed container includes an upper container part and a lower container part. A sealing connection device is provided between the upper and lower container parts. A crucible-transmitting shaft and a seed shaft are inserted into the hot-wall sealed container through respective sealing devices.

9 Claims, 5 Drawing Sheets

VAPOR CONTROLLED CZOCHRALSKI (VCZ) SINGLE CRYSTAL GROWTH APPARATUS

FIELD OF THE INVENTION

The present invention relates to semiconductor crystal growing equipments. More particularly, it relates to a vapor controlled czochralski (VCZ) single crystal growth apparatus.

BACKGROUND OF THE INVENTION

In a conventional single crystal furnace for producing compound semiconductor crystals, a hot-wall sealed container is provided outside of the crucible in order to prevent decomposition loss of the compound and to assure a proper stoichiometry of the compound single crystal. This will not result in coagulation of the mixed steam evaporated from the crucible (primarily the steam of elements with high decomposition pressure) and form the mixed vapor in the container. The other hot-wall sealed containers are integral and not easy to assemble. They cannot be opened when they are hot, and cannot be used repeatedly. Therefore, they are not convenient to operate, and it increase the manufacture cost.

The object of the present invention is to provide a czochralski single crystal growth apparatus with vapor pressure control, wherein the hot-wall sealed container can be opened when it is still hot, and can be used repeatedly. Thus, it is convenient for installation and has better sealing property. It is easy to control the vapor pressure therein.

SUMMARY OF THE INVENTION

A VCZ single crystal growth apparatus of the present invention comprises a single crystal furnace, a heating unit, mechanical transmission unit and gaseous adjustment unit. In the single crystal furnace, mounted is a hot-wall sealed container. The hot-wall sealed container comprises an upper part and a lower part, and a sealing connection device between the upper and lower parts of the container. Within the hot-wall sealed container mounted is a crucible, and a crucible-transmitting shaft and a seed crystal shaft is embedded in the hot-wall sealed container through respective sealing devices.

The sealing connection device of the container is includes an annular groove. The annular groove integrates with the top of the lower part of container, and the end of the upper part of container fits within the annular groove. At the top of the hot-wall sealed container, there is an observation window.

The sealing device of the crucible-transmitting shaft and the seed crystal shaft is consisted of sealing chamber and sealing ring. The sealing chamber has an annular groove therein, and a central hole at its bottom. The sealing ring has a groove, and it is affixed with the sealing chamber so that the outer peripheral surface is fitted tightly with the inner surface of the sealing chamber. The groove of the sealing ring and the annular groove of the sealing chamber are connected face to face to form a liquid storage chamber. An interval exists between the groove of sealing ring and the upper edge of the central hole of the sealing chamber. The height of the sealing ring is smaller than the height of the annular groove of the sealing chamber.

The crucible-transmitting shaft passes through the lower end of the sealing device, a connection accepter which faces to the sealing chamber is affixed on the crucible-transmitting shaft. The sealing chamber and the sealing ring can be integrated, which includes a liquid storage chamber. The height of the sealing ring is one third to two third of the height of the annular groove of the sealing chamber.

The seed shaft is comprised of upper and lower seed shafts. The upper seed crystal shaft is solid rod while the lower seed crystal shaft is a hollow rod. The end of the upper seed shaft has a connecting shank that fits tightly with the connecting hole of the top of the lower seed crystal shaft, and a pin passes through the connecting shank and connecting hole. The end of the lower seed crystal shaft has a seed installation hole on which is a site pinhole. The connecting shank is carved with an annular groove, and the lower edge of the annular groove is tempered with conic slant.

This VCZ single crystal growth apparatus of the present invention has the following advantages:

1. The hot-wall sealed container of the apparatus has simple structure, and is easy to assemble. It can be opened when it is hot and can be used repeatedly. The hot-wall sealed container is divided into upper and lower container parts, and has a sealing connection device therebetween. An annular groove is used to seal the sealing connection device, and boron oxide is filled into the groove. At high temperature, boron oxide is melted and thus surrounds the end of the upper container part to form liquid seal. This seal has simple structure and is better in performance, and easy to install. The container can be opened when it is hot, and will not cause any damage to the upper and lower container parts. Thus, such a hot-wall sealed container may be used repeatedly. It may even reduce the operation and manufacture cost.

2. Because the seal of the hot-wall sealed container of the apparatus is good, it is easy to control the vapor pressure within the hot-wall sealed container. The sealing between the hot-wall sealed container and the seed shaft and the crucible-transmitting shaft also utilizes the sealing of the liquid boron oxide. The liquid boron oxide, after being melt, sticks on the seed shaft and the crucible-transmitting shaft such that it fills all intervals between the sealing device and the seed shaft or crucible-transmitting shaft. This prevents the mixed vapor in the hot-wall sealed container from leaking, maintains the desired vapor pressure, and facilitates the control adjustment of the vapor pressure in the hot-wall sealed container.

3. The size of the seed shaft becomes smaller, but it is better centered and has better seal. It vibrates less when it rotates so that the crystal grows better. The lower part of the seed shaft is a hollow rod with thin wall such that it deforms less when being heated. Therefore, it can be properly conjugated with the sealing device of the hot-wall sealed container to ensure the better sealing of the sealing devices. The upper and lower parts of seed shafts are fitted tightly. It can prevent the vapor in the hot-wall sealed container from leaking through the connection. The connection surfaces of the upper and lower seed shaft are accurately machined to have a precise size such that they are well centered and do not vibrate during the rotation. This benefits the crystal growth. If the seed shaft is made of ceramic material, it has better erosion resistance, and may be used longer and reduce the secondary pollution.

4. It is convenient to adjust the vapor pressure in the hot-wall sealed container, and benefits to the adjustment of the stoichiometry of the single crystal.

5. This apparatus is mainly suitable for growing GaAs, InAs and GaP crystal. The quality of this crystal is good, and the dislocation density is low. For instance, the dislocation density of the Φ3" semi-insulating GaAs single crystal may be 7000 cm$^{-2}$ to 9000 cm$^{-2}$, and the dislocation density of the Φ4" semi-insulation arsenic gallium single crystal may reach 3.5×10$^4$ cm$^{-2}$ to 4.2×10$^4$ cm$^{-2}$.

DETAILED DESCRIPTION OF THE INVENTION

The apparatus of the present invention is described in details hereinafter in connection with the accompanying drawings.

Figure 1:
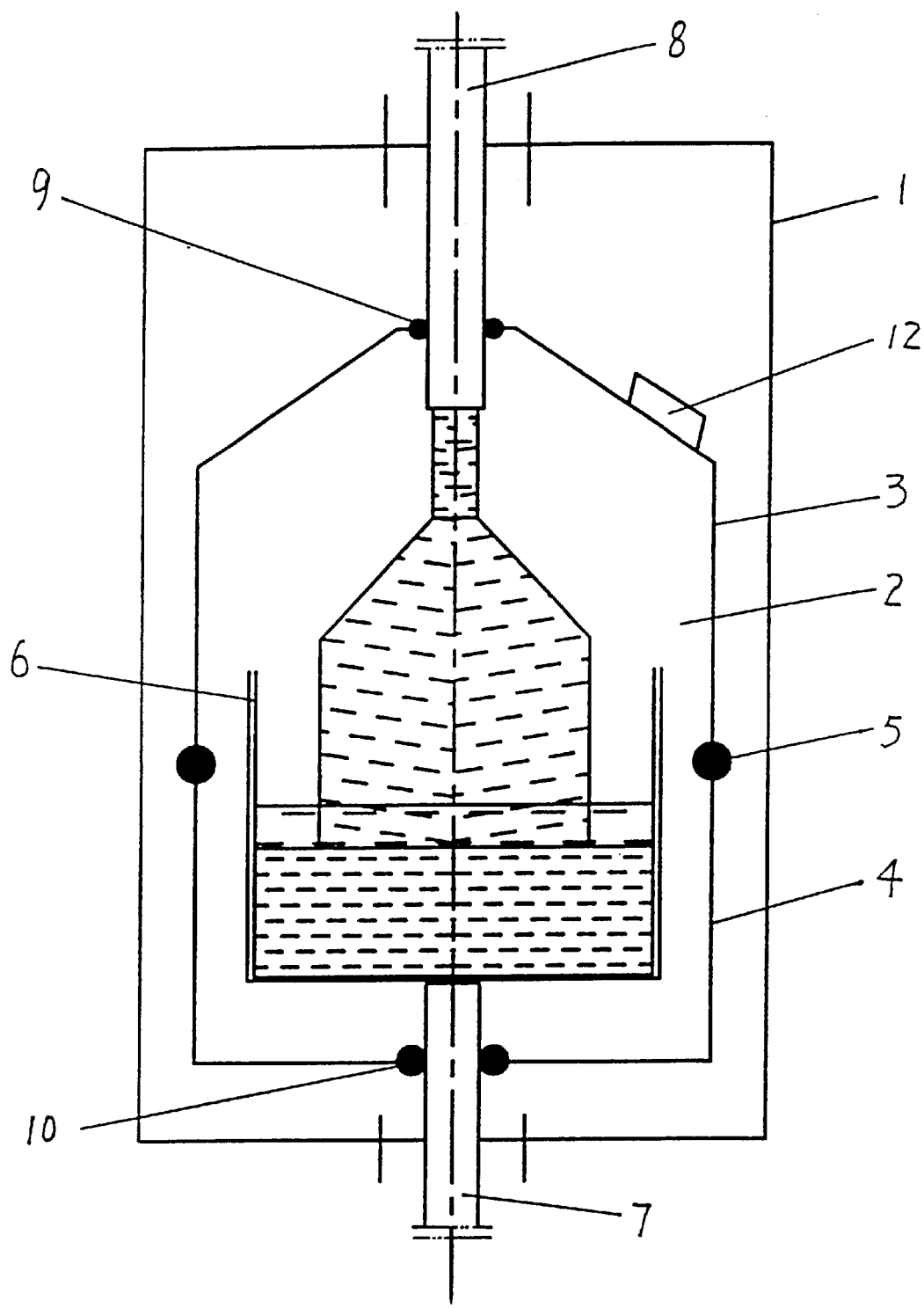
FIG. 1 is an illustration of structure of the VCZ crystal growing apparatus.

The VCZ single crystal growth apparatus is shown in FIG. 1. In FIG. 1, the numeral 1 is denoted the outfit of the single crystal furnace, and the other portions of the furnace are not illustrated herein. In the single crystal furnace 1, a hot-wall sealed container 2 is mounted. The hot-wall sealed container 2 is formed of upper container part 3 and lower container part 4, and the upper and lower container parts are connected through a sealing connection device 5. The hot-wall sealed container 2 surrounds a crucible 6, and the crucible 6 is installed on a crucible-transmitting shaft 7. Above the crucible is a seed shaft 8. And the seed shaft 8 and the crucible-transmitting shaft 7 is, respectively, inserted into the hot-wall sealed container through sealing devices 9 and 10.

Figure 2:
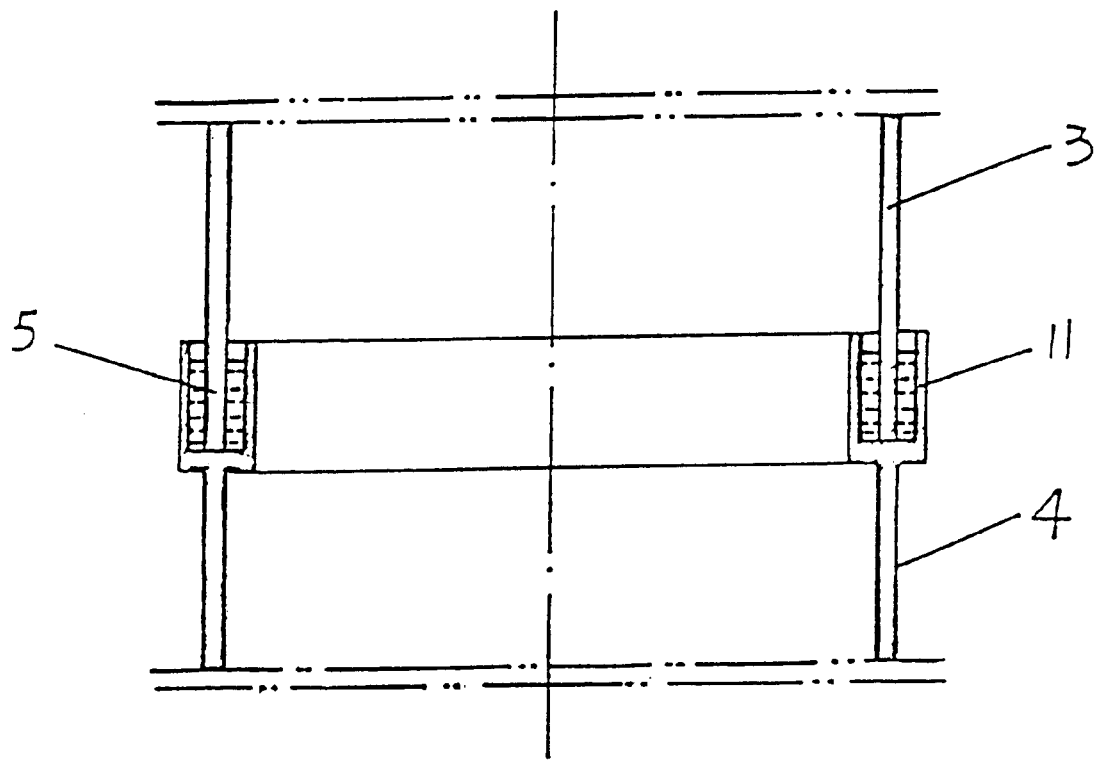
FIG. 2 is the illustration of the structure of sealing connection device.

The sealing connection device 5 comprises an annular groove 11, and the structure thereof is shown in FIG. 2. The annular groove 11 and the lower container part 4 are integrated. The end of the upper container part 3 fits within the annular groove 11, and the annular groove 11 is filled with boron oxide. On top of the hot-wall sealed container 2, there is an observation window 12.

Figure 3:
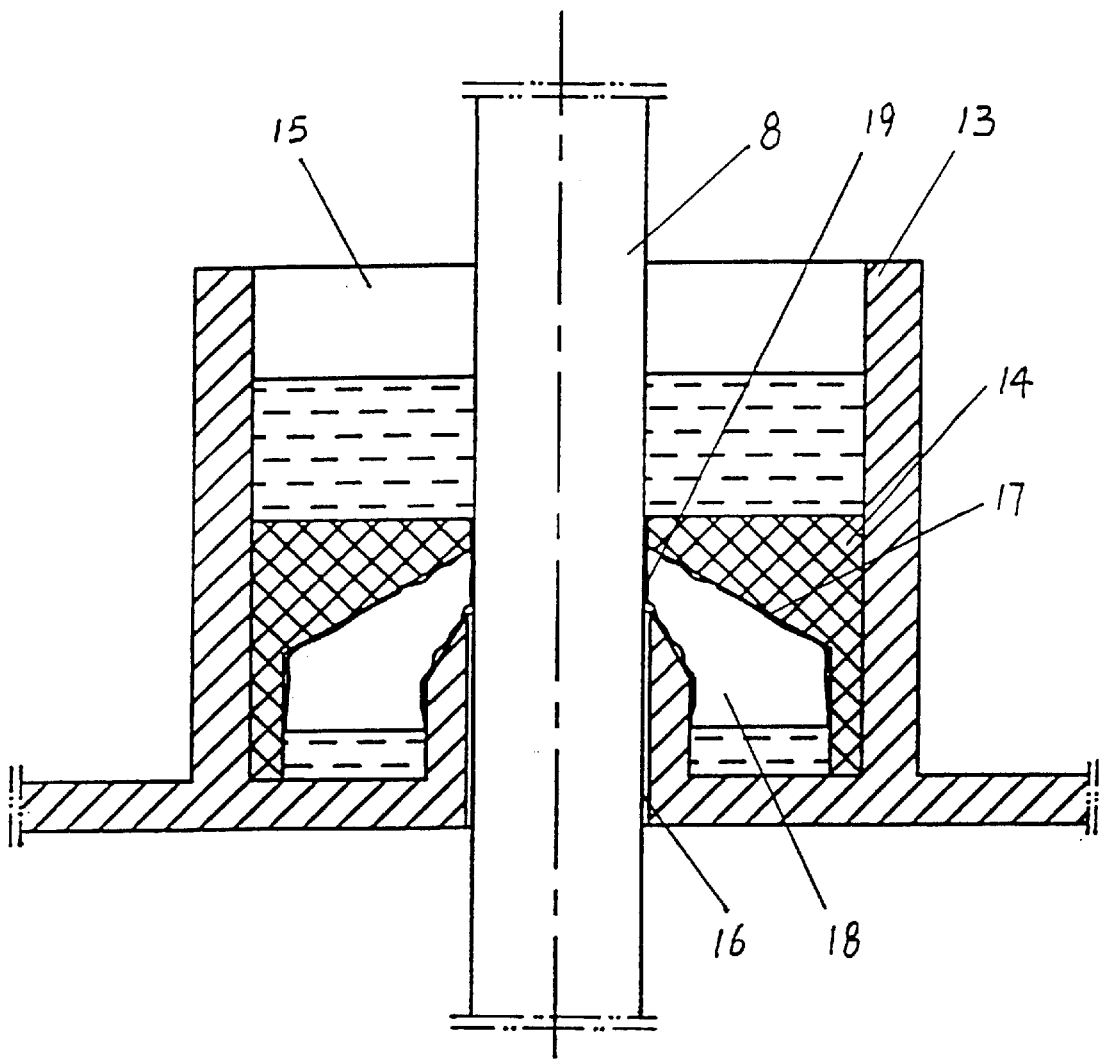
FIG. 3 is the illustration of the structure of sealing device at the seed shaft.
Figure 4:
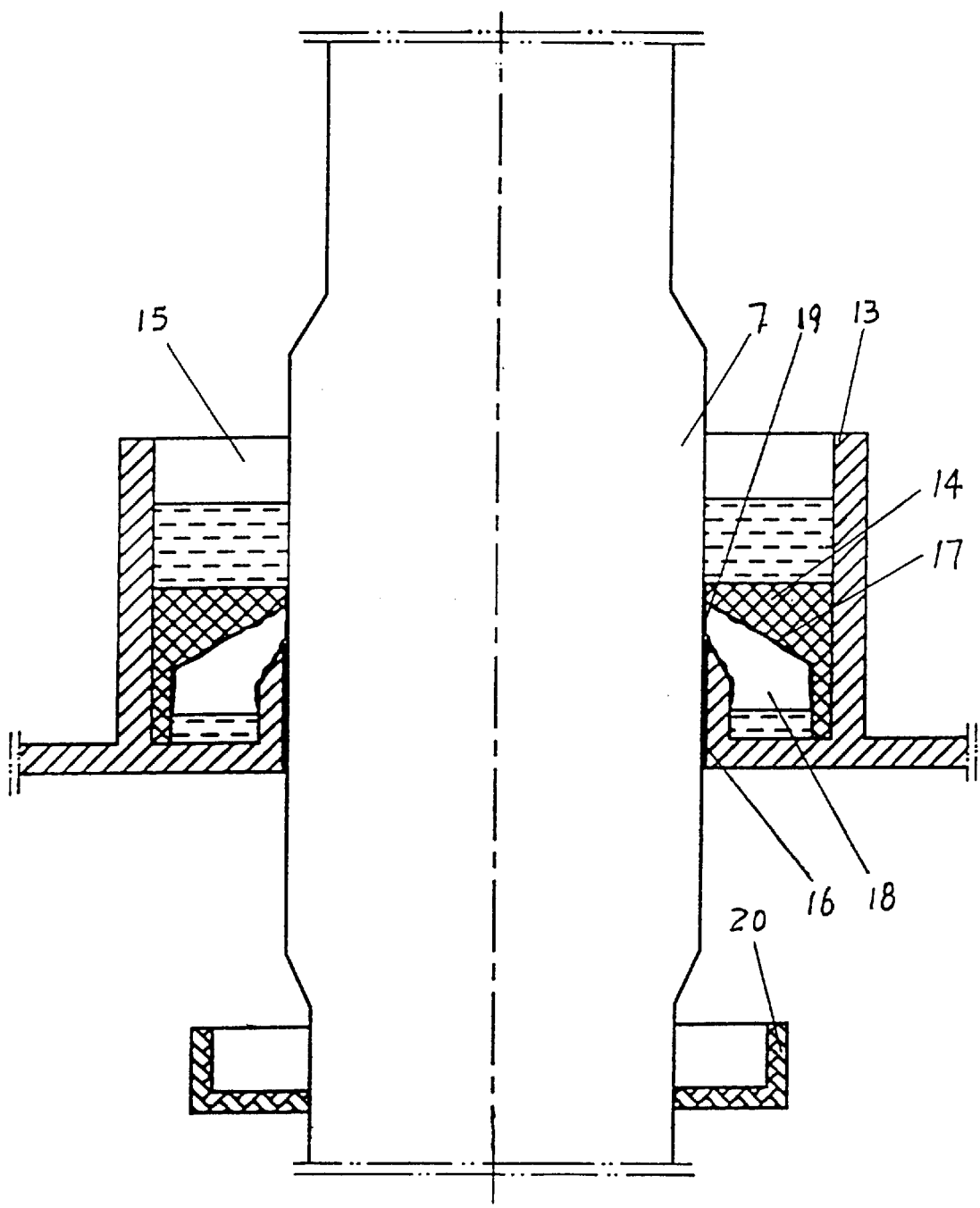
FIG. 4 is the illustration of the structure of sealing device at the crucible-transmitting shaft.

The sealing devices 9 and 10 are formed of a sealing chamber 13 and a sealing ring 14, and the structure thereof is illustrated in FIGS. 3 and 4. Inside of the sealing chamber 13 is an annular groove 15, and the bottom of the sealing chamber is of a central hole 16. The sealing ring 14 has a groove 17. The peripheral surface of the sealing ring 14 fits tightly with the inner surface of the annular groove 15 of the sealing chamber 13. The groove 17 of the sealing ring 14 and the annular groove 15 of the sealing chamber 13 face each other to form a liquid storage chamber 18. The opening of the sealing ring 14 and the upper edge of the central hole 16 form an interval 19 which is the entry of the liquid storage chamber 18. The height of the sealing ring 14 is less than that of the annular groove 15 in the sealing chamber 13. The annular groove 15 of the sealing chamber 13 is filled with boron oxide. Beneath the sealing device 10, a connection accepter 20 is affixed on the crucible-transmitting shaft 7 and has its upwards opening.

Figure 5:
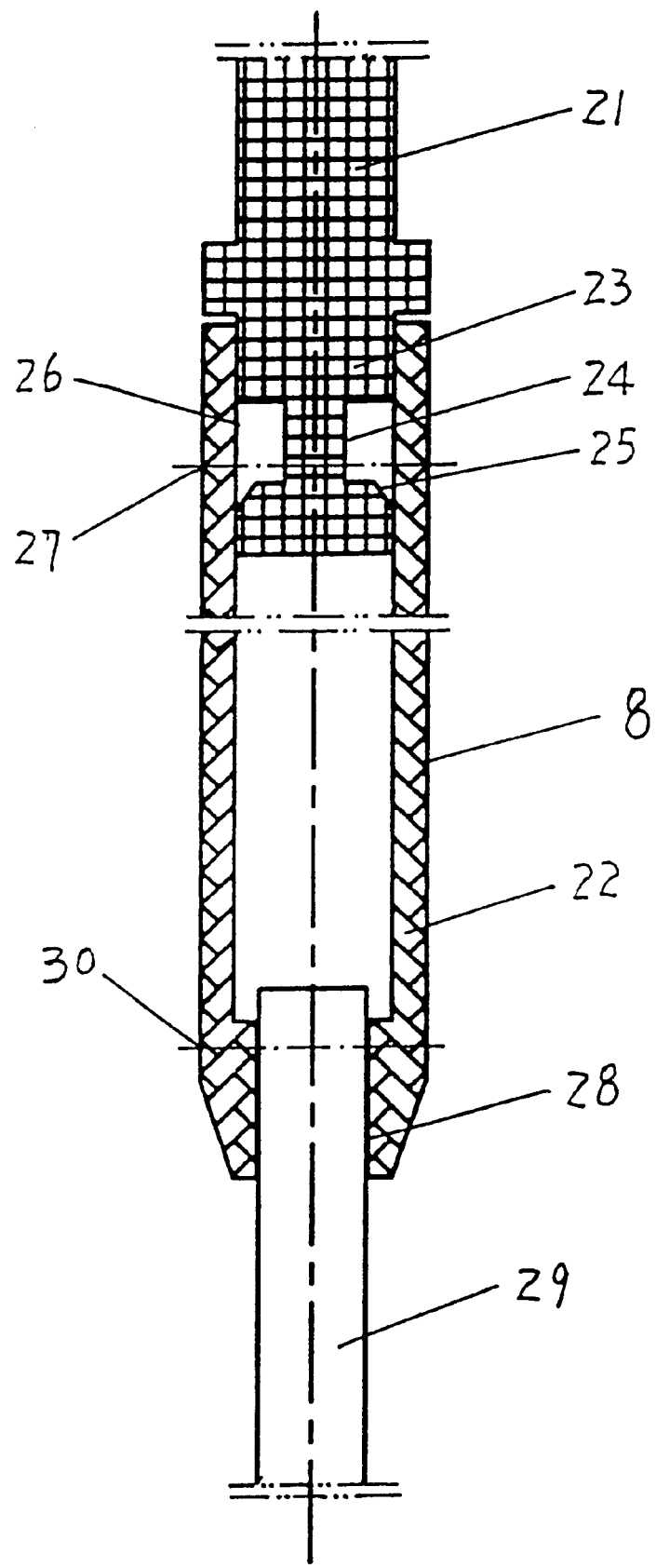
FIG. 5 is the illustration of the structure of seed shaft.

As illustrated in FIG. 5, the seed shaft 8 is formed of an upper seed shaft 21 and a lower seed shaft 22. The upper seed shaft is solid and the lower seed shaft is a hollow rod. The end of the upper seed shaft 21 has a connecting shank 23, and an annular slot 24 is in the middle of the connecting shank 23 carved. The lower edge of the opening of the annular slot 24 is tempered with conic slant 25. The connecting shank 23 and a connecting hole 26 of the top of the lower seed shaft 22 fit tightly with each other, and a pin 27 is inserted through the connecting shank 23 and connecting hole 26 to fix them together. The end of the lower seed shaft 22 has a seed installation hole 28, in which a seed crystal 29 may be mounted, and a locking pin 30 is used to fix the seed crystal 29 therein. The upper and lower seed shafts are made of ceramic material.

During the operation of the VCZ single crystal growth apparatus, the compound raw materials will be put into the crucible 6. For instance, when pulling GaAs crystal, Gallium and Arsenic are put into the crucible 6. After connecting the upper and lower container parts, the Gallium and Arsenic are heated, and at the same time the boron oxide in the sealing connection device 5, and in the sealing devices 9 and 10 is heated, too. When the boron oxide is melted to form a liquid sealing, a very well sealed space is formed in the hot-wall sealed container 2. In this sealed space, the control of Arsenic vapor pressure can be maintained so that the ratio of the Arsenic to Gallium may meet the prescribed requirement, and the decomposition loss of the compound may be prevented. In addition, the temperature gradient of crystal is small when this growth method is used. The quality of the crystal will be increased, while the dislocation density of the single crystal will be decreased. Moreover, the deformation of the seed shaft used in this apparatus is small and the sealing is good. And the central alignment is good and there is little vibration during rotation so as to benefit the growth of the crystal. The crystal growth finished, the hot-wall sealed container 2 can be open right away to take the crystal out. Then the hot-wall sealed container 2 may be reused. The operation is quite simple.

What is claimed is:

1. A straight pulling single crystal growing apparatus of steam pressure control comprising:

a single crystal furnace, a heating unit, a mechanical transmission unit, a gaseous adjustment unit, a hot-sealed container mounted in the single crystal furnace, within the hot-sealed container mounted a crucible, and a crucible-transmitting shaft and a seed crystal shaft inserted into the hot-sealed container through respective sealing devices, said hot-sealed container including an upper container part and a lower container part, and a sealing connection device is provided between the upper and lower container parts, wherein said sealing connection device of the container is formed of an annular groove, that integrates with the top of the lower container part, and the lower end of the upper part of container fits within the annular groove, and the annular groove is filled with melted boron oxide liquid to form the seal.

2. The straight pulling single crystal growing apparatus of steam pressure control as set forth in claim 1, wherein there is an observation window provided at the top of the hot-sealed container.

3. The straight pulling single crystal growing apparatus of steam pressure control as set forth in claim 1, wherein the seed crystal shaft is formed of upper and lower seed crystal shafts, and the upper seed crystal shaft is solid rod, while the lower seed crystal shaft is a hollow rod, and wherein the lower end of the upper seed crystal shaft has a connecting shank that fits tightly with a connecting hole of the upper end of the lower seed crystal shaft, and a pin passes through the connecting shank and the connecting hole, and wherein the lower end of the lower seed crystal shaft has a seed crystal installation hole, on which is a site pinhole.

4. The straight pulling single crystal growing apparatus of steam pressure control as set forth in claim 3, wherein the connecting shank is carved with an annular groove, and the lower edge of the annular groove is tempered with conic slant.

5. The straight pulling single crystal growing apparatus of steam pressure control comprising:
- a single crystal furnace;
- a heating unit;
- a mechanical transmission unit;
- a gaseous adjustment unit;
- a hot-sealed container mounted in the single crystal furnace, within the hot-sealed container mounted a crucible; and
- a crucible-transmitting shaft and a seed crystal shaft inserted into the hot-sealed container through respective sealing devices, said hot-sealed container including an upper container part and a lower container part; and
- a sealing connection device provided between the upper and lower container parts, wherein said sealing device through which the crucible-transmitting shaft and the seed crystal shaft pass is formed of a sealing chamber and a sealing ring, and the sealing chamber has an annular groove therein and a central hole at its bottom, and wherein said sealing ring has a groove, and is affixed to said sealing chamber such that the outer peripheral surface of the sealing ring fits tightly with the inner surface of the sealing chamber, and the groove of the sealing ring and the annular groove of the sealing chamber face each other to form a liquid storage chamber in which melted boron oxide liquid is filled to form a tight seal.

6. The straight pulling single crystal growing apparatus of steam pressure control as set forth in claim 5, wherein an interval exist between the ring opening of the sealing ring and the upper edge of the central hole of the sealing chamber, and the height of the sealing ring is smaller than the height of the annular groove of the sealing chamber.

7. The straight pulling single crystal growing apparatus of steam pressure control as set forth in claim 6, wherein the height of the sealing ring is one third to two third of that of the annular groove of the sealing chamber.

8. The straight pulling single crystal growing apparatus of steam pressure control as set forth in claim 5, wherein the crucible-transmitting shaft passes through the lower end of the sealing device, and on the crucible-transmitting shaft affixed is a connection accepter facing in the same direction of the sealing chamber.

9. The straight pulling single crystal growing apparatus of steam pressure control as set forth in claim 5, wherein the sealing chamber and the sealing ring are integrated to form the liquid storage chamber.

* * * * *